United States Patent [19]
Campbell et al.

[11] Patent Number: 5,838,650
[45] Date of Patent: Nov. 17, 1998

[54] IMAGE QUALITY COMPENSATION METHOD AND APPARATUS FOR HOLOGRAPHIC DATA STORAGE SYSTEM

[75] Inventors: Scott Patrick Campbell, Chatham; Kevin Richard Curtis, Summit; Thomas J. Richardson, South Orange, all of N.J.

[73] Assignee: Lucent Technologies Inc., Murray Hill, N.J.

[21] Appl. No.: 670,923

[22] Filed: Jun. 26, 1996

[51] Int. Cl.$^6$ ........................................................ G11B 7/00
[52] U.S. Cl. ............................ 369/103; 359/10; 365/125
[58] Field of Search ............................ 369/103, 99, 100; 365/106, 127, 125, 216; 359/10, 11, 32, 21, 29, 107

[56] References Cited

U.S. PATENT DOCUMENTS

| | | | |
|---|---|---|---|
| 5,202,875 | 4/1993 | Rosen et al. | 369/94 |
| 5,319,629 | 6/1994 | Henshaw et al. | 369/103 |
| 5,450,218 | 9/1995 | Heanue et al. | 359/21 |
| 5,465,238 | 11/1995 | Russell | 365/234 |
| 5,510,912 | 4/1996 | Blaum et al. | 359/21 |
| 5,684,612 | 11/1997 | Wilde et al. | 359/7 |
| 5,689,351 | 11/1997 | Hong | 359/10 |
| 5,696,714 | 12/1997 | Russell | 365/106 |
| 5,719,691 | 2/1998 | Curtis et al. | 359/11 |

OTHER PUBLICATIONS

D. Psaltis et al. "Holographic Memories", *Scientific American*, pp. 70–76 (1995).

V.N. Morozov, "Theory of holograms formed using a coded reference beam", *Sov. J. Quantum Electron*, vol. 7, No. 8 (1997).

A. Dickinson, et al. "Standard CMOS Active Pixel Image Sensors for Multimedia Applications", Sixteenth Conference on Advanced Research In VLSI, pp. 214–224 (1995).

A. Pu, et al. "Shift Multiplexed Holographic 3–D Disk", OSA Technical Digest Series, vol. 10, pp. 219–221 (1995).

*Primary Examiner*—Ali Neyzari
*Attorney, Agent, or Firm*—Robert E. Rudnick; John M. Harman

[57] ABSTRACT

Feedback is employed in a holographic memory system to facilitate rapid access to information in a stored data page. This feedback technique provides compensation for thermal, optical and/or mechanical variations in the system components that tend to interrupt the projection of a data page image on a sensor array. A page indicator or mark is stored in a holographic storage medium with a page of data such that, during playback, a quality, e.g., intensity, of its projected image is indicative of the quality of the corresponding projected data page image. A corresponding page indicator sensor is employed with the associated sensor array to detect the quality of a projected page indicator image. The projected data page image can then be read by sensor elements of the detector based on the detected quality of the page indicator image. Such a detector can be implemented in an active pixel sensor (APS) array with the page indicator sensor being implemented as a region of the APS array. Registration of the sensor array elements with respect to projected data pixels of the data page image can also be aligned to an absolute or substantially nearest pixel alignment by a similar feedback technique.

22 Claims, 3 Drawing Sheets

IMAGE QUALITY COMPENSATION METHOD AND APPARATUS FOR HOLOGRAPHIC DATA STORAGE SYSTEM

FIELD OF THE INVENTION

The invention relates to holographic data storage systems.

BACKGROUND OF THE INVENTION

Researchers have reported that holographic memory systems are capable of providing relatively fast retrieval of large amounts of data compared to conventional magnetic disk storage systems or compact disk-read only memories (CD-ROM's). Data is typically stored in a holographic memory as a hologram formed in a photo-sensitive storage medium. The hologram represents data as a pattern of varying indexes of refraction, absorption, polarization and/or reflectivity in the storage medium.

The hologram pattern is typically formed by causing two particular light beams to intersect at a region of the storage medium. These two light beams are referred to as the signal beam and the reference beam. The signal beam is often formed by transmitting laser light through a spatial light modulator (SLM), such as a liquid crystal display (LCD) screen. The LCD screen contains a pattern of clear and opaque regions corresponding to a two-dimensional depiction of the digital data to be stored. The laser light signal emanating from the LCD screen is then relayed by lenses to create the signal beam.

In systems using Bragg selectivity as a means for recording the hologram, the reference beam is a collimated light beam having particular characteristics, such as a particular wavelength and angle of incidence with respect to the storage medium. In such systems, the recorded data can be read out or played back by illuminating the storage medium with a collimated light beam having the same characteristics as the reference beam used for recording the hologram pattern. The storage medium defracts, absorbs and/or polarizes the playback reference beam in such a manner to cause a projected image of the original data representation on a photodetector array, such as a charged-coupled device (CCD).

A typical CCD array contains an array of sensing elements which operate by simultaneously sensing light and dark patterns of the projected data image. Then, although the amount of light is detected simultaneously by each sensor element of the CCD array, electrical signals representing such detected light can only be sequentially read out by rows or columns. These electrical signals can then be used by a processing system such as a computer system. Digital holographic memories are described generally in D. Psaltis and F. Mok, "Holographic Memories", *Scientific American*, pp. 70–76 (November, 1995), which is incorporated by reference herein.

Relatively large information densities have been achieved with holographic memory systems by recording successive pages of data onto common regions of a holographic storage medium. Such recording of different pages can be achieved using Bragg selectivity for differentiating between successively recorded pages, such as by varying the angle of incidence or wavelength of the reference beam.

Nevertheless, commercial applications of holographic memory systems for storing and retrieving data are currently not available. In the read out of a recorded data page from the storage medium, the particular system characteristic employed for storing the data page must be substantially precisely duplicated to project the data page image on the photodetector array. In systems employing Bragg selectivity for recording multiple data pages, the required precision of the reference beam for read out is dependent on the thickness of the storage medium. Thicker mediums require greater precision. For instance, if the storage medium is 1 cm thick and the reference beam angle deviates by 0.001° or approximately $2 \times 10^{-5}$ rad, then the projected data page can effectively disappear.

During playback, thermal expansion and other thermal effects as well as physical and optical disturbances of the mechanical relationship between the holographic system components can cause variations of the system characteristics from those originally used for recording. Such variations tend to interfere with distinguishing the reading of one data page from another. Known systems do not provide effective compensation for such variations. Moreover, such variations or differences are particularly troublesome with movement of the storage medium from one holographic system to another such as from a recording system to a playback system.

Further, reported systems do not provide a technique to compensate for misalignment between photodetector array sensor elements and the projected pixel images of a data page image. Without such alignment or pixel registration, projected pixels of the data page may overlap adjacent sensor elements. Such overlap makes reading of the data very difficult.

As a result, a need exists for a technique that provides rapid and efficient access to and read out of a data page in a holographic system.

SUMMARY OF THE INVENTION

The invention is based on the novel and unobvious use of feedback in a holographic memory system to facilitate access to information in a stored data page. The feedback of the invention can provide compensation for thermal, optical and/or mechanical variations in the relationship between system components that tend to degrade the projection of a data page image. A data page is an encoded one-or two-dimensional representation of at least one data bit which can be organized into a row and column format or otherwise.

The invention employs a page indicator or mark stored in the storage medium within or proximate an associated data page. The page indicator is stored such that, during playback, the image quality, e.g., intensity or sharpness, of the projected page indicator is indicative of the image quality of the corresponding projected data page on a detector. Then, during playback, the image quality of the projected page indicator is monitored while a parameter of the system is varied. This system parameter varied is a parameter originally used to record or multiplex the data page and the page indicator in the storage medium. For instance, if Bragg selectivity was employed to record the data page and page indicator, then the system parameter controlling reference beam characteristics, such as the angle of incidence and/or wavelength, is varied. Then, based on the monitored image quality of the projected page indicator, the parameter is either further varied, or not varied and the data from the associated data page that is projected on the detector is read.

Because the page indicator and data page images are stored such that the image quality of the projected page indicator is indicative of the image quality of the corresponding projected data page, detection of the image quality of the projected page indicator can be relied upon as feedback for indicating when the data page image is projected on the detector with an adequate signal-to-noise ratio for reading its data. Further, because the feedback is based on a projected image, it can advantageously be used to efficiently compensate for thermal, optical and/or mechanical variations in the relationship between system components or storage medium that would otherwise degrade the projection of a data page on the detector.

Based on detecting an adequate image quality for the projected page indicator, page identity information, such as a page number, projected within or proximate the data page image can be detected. Such page identity information provides feedback for identifying whether the projected data page is the desired data page when a storage medium contains a plurality of data pages. If the projected page is not the desired page, then a system characteristic can be further varied for causing a projection of the desired data page.

Pixel registration between the sensor elements and the data pixels in the data page image can be achieved using a similar feedback technique. For instance, at least one registration key pattern is recorded in the storage medium in a known position within or proximate to a data page. Detection of this registration key can be used to determine the amount of rotational and translational movement of the sensor elements relative to the projected data page image required to achieve pixel registration. Such a determination, can be made by, for example, based on a relative difference in position and orientation of a projected key and an expected location and orientation for the projection of the key.

Although it is possible to employ separate detectors for monitoring the page identifier and reading the identity information as well as a CCD-type array sensor for reading the data page, it is advantageous to use a single CMOS active pixel sensor (APS) array for the previously listed sensors. APS arrays require low power, are relatively inexpensive to fabricate and provide individually-addressable sensor elements that enable read out from individual or groups of sensors. Such arrays provide a substantial improvement over more costly and non-individually addressable conventional CCD arrays. Also, because the APS arrays have sensor elements that are individually addressable, respective regions of the APS array can advantageously be used for detecting the page indicator, page identity information and pixel registration key images without using separate sensors. Such detection by the APS can typically be performed faster than with conventional CCD arrays.

Additional features and advantages of the present invention will become more readily apparent from the following detailed description and accompanying drawings.

DETAILED DESCRIPTION

Figure 1:
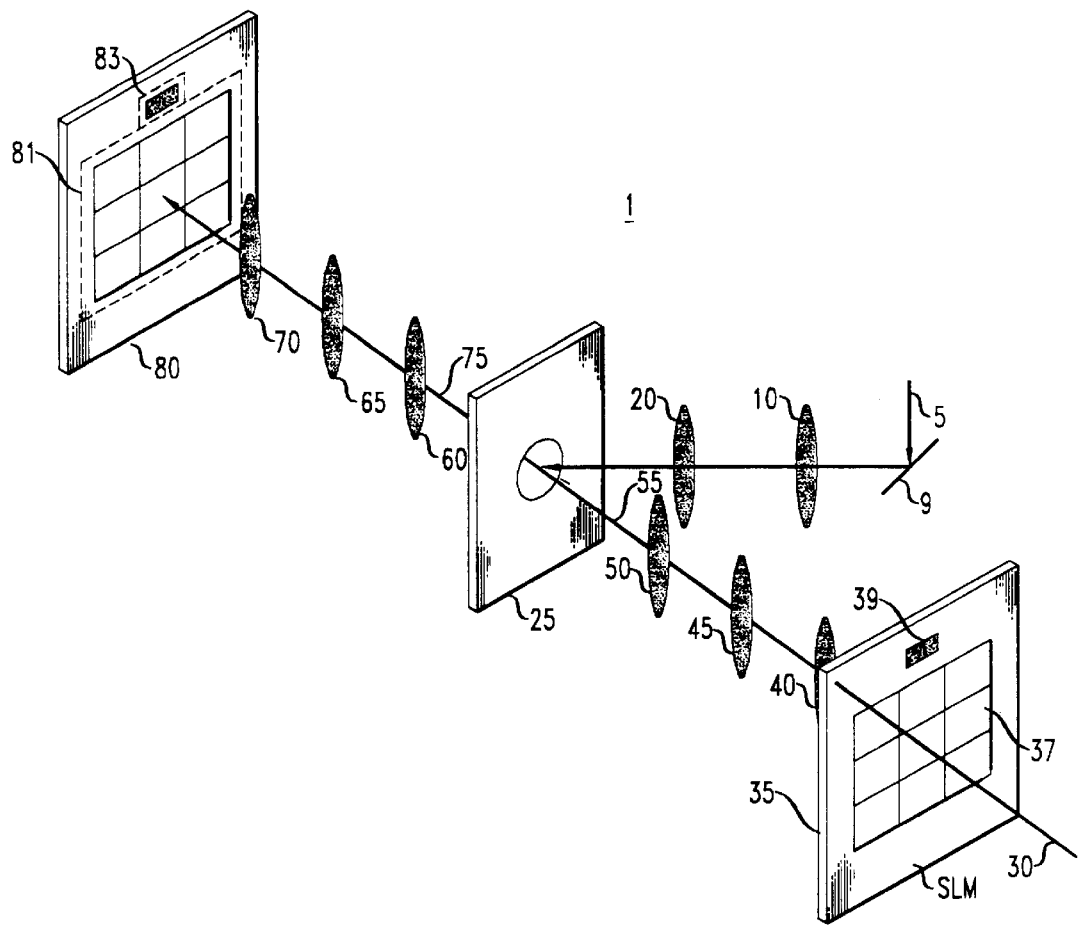
FIG. 1 illustrates a schematic block diagram of an exemplary holographic storage system for recording and reading data pages and associated page indicators in accordance with the invention.

The invention is based on the novel and unobvious use of feedback in a holographic memory system to facilitate rapid access to information in a stored data page. A data page is an encoded one- or two-dimensional representation of data which can be digital data organized into a row and column format or otherwise. The feedback techniques provide the possibility of compensation, during playback, for thermal, optical and/or mechanical variations in the relationship between system components that tend to reduce the image quality of a projected data page image on a detector which increases the bit error rate (BER).

The invention employs a page indicator or mark stored in the holographic storage medium within or proximate an image of an associated data page. The page indicator is stored such that during playback the image quality, e.g., intensity or sharpness, of the projected page indicator is indicative of the image quality of the corresponding projected data page on a detector. Then, during playback, the quality of the projected page indicator is monitored and when the monitored quality indicates that the corresponding projected data page is projected with an adequate signal-to-noise ratio (SNR) for reading, the data page is read by sensor elements of the detector.

The determination of an adequate SNR required for reading the projected data page is dependent on the type of sensors, storage medium and other characteristics of the system and can be based on respective sample measurements for the type of detector, storage medium, light source and/or other components of the system. Moreover, the particular image quality monitored for the projected page indicator that indicates that an adequate SNR is present for the projected data page can also be based on the types of sensors, storage medium and other characteristics of the system and can include, for example, a measure of intensity or brightness and/or sharpness of the projected image. Such quality measures can, for example, be based on the previously described sample measurements or additional sample measurements. The SNR of a projected image is also based on the relative alignment of the storage medium with respect to the other components of the holographic memory system and the system characteristic used to record the image in a multiplexed manner.

Thus, during playback in accordance with the invention, a system parameter originally employed to record or multiplex the data page and page indicator images in the storage medium can be varied while the image quality of the projected page indicator is monitored. When an image quality is detected that indicates that the associated data page is projected with an adequate image quality or SNR, the associated data page image is read by the detector and the corresponding read data is provided to other system components for processing. In this manner, the invention advantageously relies on the monitoring of the image quality of the projected page indicator to indicate when an associated data page image is adequately projected on the sensor elements for reading the data contained therein. Such a technique provides the possibility of efficient compensation for thermal, optical and/or mechanical variations between system components that tend to degrade the image quality of the projected data page image.

Because the invention is based on the detection of the page indicator image associated with a projected data page image, the particular method chosen to record the data page is not critical to practicing the invention. The invention is described with regard to an exemplary holographic memory system I of FIG. 1 that uses Bragg selectivity related parameters, such as those parameters controlling the reference beam wavelength or angle of incidence, for recording and playback of a data page. However, it should be readily understood that other system parameters and other recording techniques can be employed in accordance with the invention. For example, it is possible to record a data page using other Bragg selectivity techniques such as by shifting the recording medium relative to the signal and reference beams between page exposures.

Also, the data page and page indicator can be recorded by a similar technique referred to as "shift holography" that partially overlaps holograms produced by shifting the recording medium relative to the signal and reference beams between page exposures. Shift Holography is described in greater detail in "1995 OSA Conf. on Optical Computing", *OSA Technical Digest Series*, vol. 10, pp. 219–221 (1995), which is incorporated by reference herein. In such a system, the system parameter used for recording can be the relative position of the reference beam striking the storage medium. Another storage technique that enables the use of a relatively thin recording medium, e.g., typically 1 mm or less, that achieves storage densities on the order of shift holography or greater is Phase Correlation Multiplexing Holography (PCMH), which is described in U.S. patent application Ser. No. 08/435,705, assigned to the assignee of the present invention and incorporated by reference herein. PCMH employs relative positions of the storage medium and light beams as the system parameter relied upon for differentiating successive recorded pages instead of the Bragg angle.

In the system 1, an incoming light beam 5, typically at least partially a plane wave, serves as the reference beam. This reference beam 5 reflects off a mirror 9 and is 4-F imaged by lenses 10 and 25 onto a holographic storage medium 25. It is possible for the storage medium to be, for example, iron doped $LiNbO_3$, or any other material composition suitable for optical information storage. The lenses 10 and 20 are arranged in 4-F configuration to produce a corresponding reference beam image on the medium 25. Magnification of the beam image is determined by focal lengths of the lenses 10 and 20.

A second incoming beam 30 is modulated by a spatial light modulator (SLM) 35. It is possible for the SLM 35 to be a LCD screen that contains a one- or two-dimensional pattern of clear and opaque regions representing a one- or two-dimensional digital data page of information 37 to be stored. In addition, the SLM 35 also contains a page indicator 39 that is used in accordance with the invention and is described in detail below with regard to FIGS. 2 and 3. Although the page indicator 39 image is shown outside of the data page image 37, it should be readily understood that the page indicator 39 can be disposed within or overlapping the data page image 37 in accordance with the invention.

Figure 3:
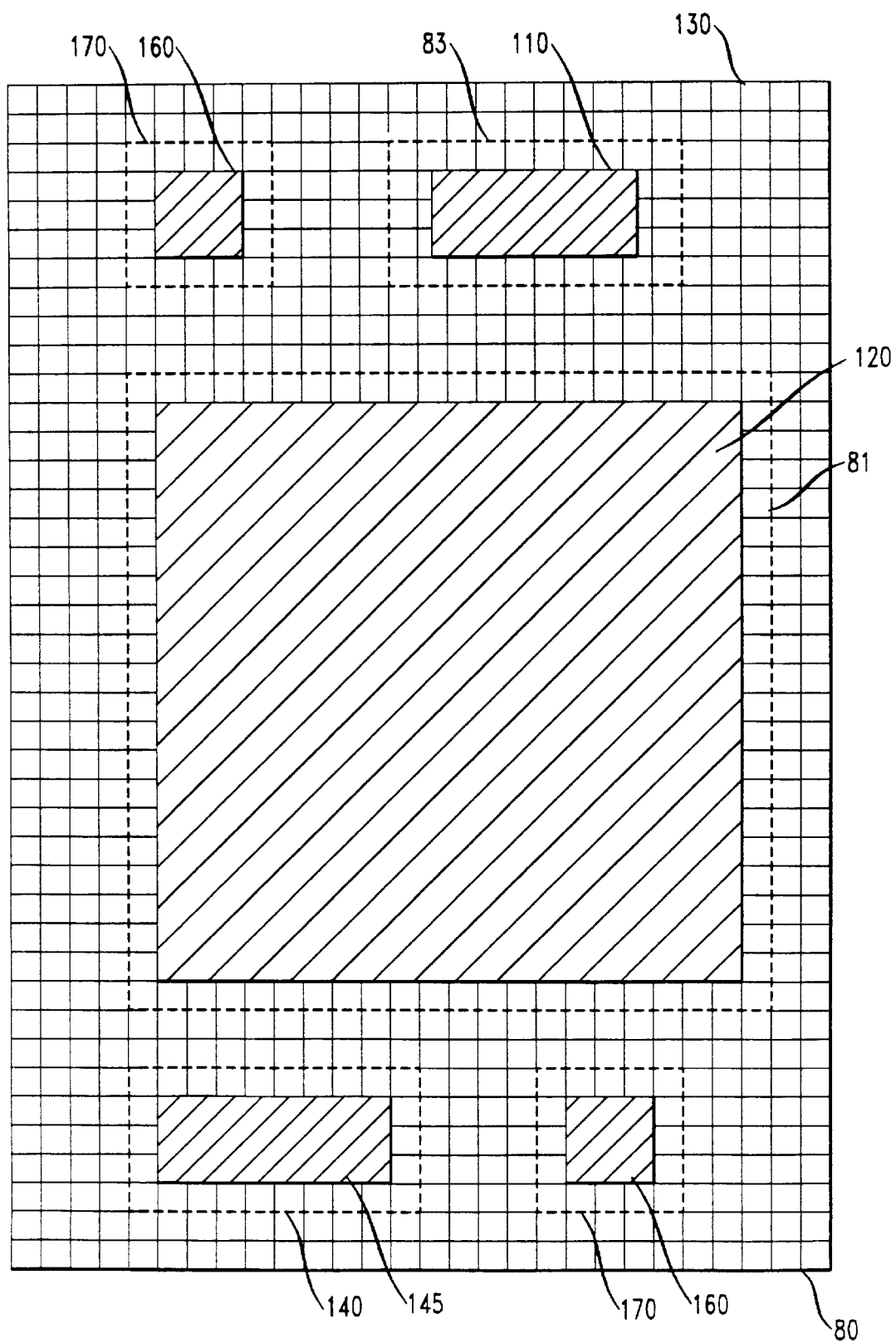
FIG. 3 illustrates an exemplary projection of page indicator and data page images from a holographic storage medium onto corresponding detectors of the system of FIG. 1.

The light signal emanating from the SLM 35 is relayed by lenses 40, 45 and 50 to create a signal beam 55 that strikes the medium 25. A corresponding set of lenses 60, 65 and 70 relay a data page image from a corresponding projection 75 on to a detector 80. The detector 80 includes a plurality of sensor elements 81 for reading the data of the projected data page image as well as a page indicator sensor 83 for detecting the associated page indicator image. It is further possible for the sensor elements 81 to be arranged into an array as shown in FIG. 3.

In order to record different data page images in the storage medium 25, it is possible to record such images in an angle multiplexed manner. According to such recording technique, different reference beam angles of incidences with respect to the storage medium 25 can be used for recording respective data page images. For example, the mirror 9 can be rotated to produce the desired angle of incidence for each page image. In the alternative, an acousto-optic cell can be employed to provide the desired reference beam angle of incidence as is described in greater detail below.

The set of the lenses 40, 45 and 50, and the lens set 60, 65 and 70 both are arranged in a 4-F configuration. In such a manner, a Fourier transform of the data page and page indicator images is recorded as a hologram in the medium 25 and projected in a reconstructed manner on the detector 80. A 4-F configuration requires particular focal distance spacing such that, e.g., the data pattern screen 35-to-lens 40 spacing is equal to the focal distance of the lens 40, the lens 70-to-detector 80 spacing is equal to the focal distance of the lens 70, and the lens-to-lens spacing of corresponding lens pairs 45 and 50, and 60 and 65 are the sums of the focal distances of the respective lenses in the pairs.

The use of the Fourier transform facilitates error detection and correction in the reading of the information from the data page. However, such transform is not critical to practicing the invention. Omitting a single lens from the lens set 40, 45 and 50 replaces the Fourier transform at the medium 25 with the two-dimensional data page generated by the SLM 35. In such an arrangement, a corresponding omission of a lens from the set 60, 65 and 70 results in the proper reconstruction of the data page at the detector 80. In accordance with the invention, the data page image can be stored as a one- or two-dimensional data array, Fourier transformed image plane or other full or partially transformed image plane in the medium 25 as long as the desired data page format is projected on the detector 80.

It is possible to record multiple data pages in the storage medium by changing at least one system parameter for recording respective pages. For Bragg selectivity, it is possible to use different system parameter settings producing corresponding different reference beam wavelengths or angles of incidences for recording each respective data page. For example, if the storage medium 25 is on the order of 1 cm thick and the reference beam wavelength is approximately 500 nm, then multiple data pages can be recorded in the storage medium 25 at, for example, five sync null separations which correspond to employing reference beam wavelengths which differ by approximately 0.25 nm between recorded data pages or reference beam angles of incidences which differ in angle by approximately $10^{-4}$ rad between recorded data pages.

An exemplary technique for varying the angle of incidence for recording is to use a conventional acousto-optic cell. Such a cell is typically capable of achieving an angle shift of approximately 1° over a time duration on the order of approximately 10 μs. However, this angle can then be multiplied optically to provide a variation of up to approximately 10° with no additional delay in the time to achieve such variation. Further, for PCMH, it possible to employ different relative positions of a phase mask and the storage medium 25 to record respective pages. In an exemplary PCMH system, it is possible to record respective data pages using differences in such relative positions by distances on the order of 10 μm between data pages.

During playback or read out, the reference beam 5 can be used to project a data page image on the detector 80. Thus, a playback-only system can be produced in accordance with the invention from the system 1 of FIG. 1 by omitting the SLM 35, lenses 40, 45 and 50 as well as the incoming beam 30. During playback, in order to produce an image of a desired data page from the medium 25, the system parameter setting used to record that data page must be precisely reproduced. For instance, in a system employing Bragg selectivity, reproduction of the Bragg selectivity parameter, such as the reference beam wavelength, with a variation on the order of typically 0.01% or less, can cause a projected data page image to disappear. Moreover, reproduction of the exact system parameter is often difficult to achieve and is exacerbated by thermal, optical and/or mechanical variations in the relationship between system components as well as optical variations in the storage medium 25.

However, during playback, the system 1 advantageously relies on the feedback of detecting the quality of the page indicator projection 39 to indicate when the associated projection of the data page possesses an adequate SNR for reading by the detector 80. Accordingly, because the system 1 relies on this feedback it can efficiently compensate for the thermal, optical and/or mechanical variations in system that often causes a degradation and reduction in SNR of the projected data page on the detector 80.

In accordance with one embodiment of the invention, the system parameter originally used to record the images of the data page and page indicator in the storage medium is varied within a range that matches the range employed for recording a respective data page or pages. Thus, if a plurality of data pages were recorded over a range of, for example, 10° , then the same range of 10° should be used during playback. During playback, when the reference beam angle of incidence matches the angle used for recording including any thermal, optical and/or mechanical variations, corresponding images 110 and 120 of the page indicator and a data page are projected on to the page indicator sensor 83 and the sensor array 81, respectively, as shown in FIG. 3, which is described in detail below. The page indicator sensor 83 then generates a signal based on the quality of the page indicator image 110 illuminating it.

Figure 2:
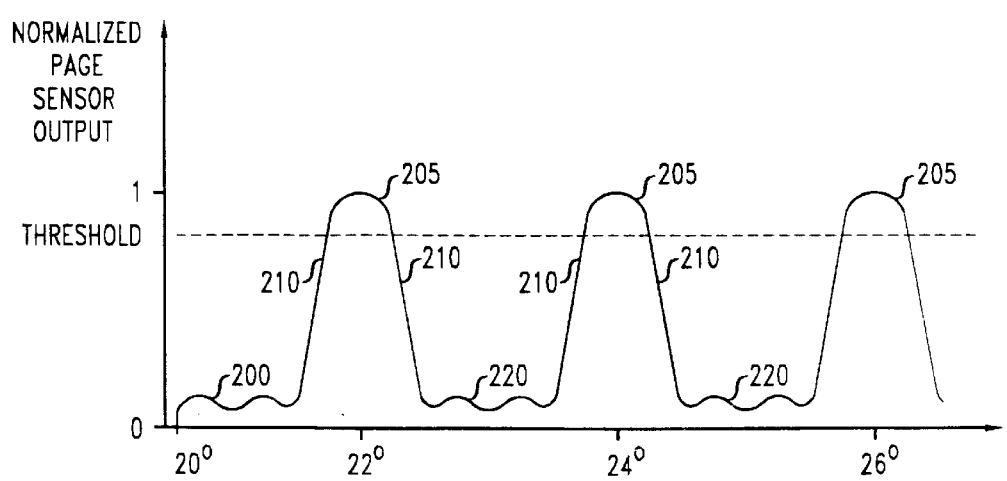
FIG. 2 illustrates an exemplary output signal of a page indicator sensor of FIG. 1.

An exemplary normalized output signal 200 for the page indicator sensor 83 is shown in FIG. 2. The signal 200 was generated during the varying of the reference beam angle of incidence for an exemplary storage medium 25. In FIG. 2, the sensor 83 detected the intensity quality or brightness of the indicator image. Also, in FIG. 2, relatively bright illumination of the sensor 83 occurred at approximate peaks 205 of the signal 200 which correspond reference beam angles of incidences 22°, 24° and 26° . These angles correspond to reference beam angles of incidences used to record respective data page images and corresponding page indicators in the storage medium 25 of FIG. I As the system varies the reference beam angle of incidence from one of the angles 22°, 24° and 26° , the corresponding intensity of the page indicator image illuminating the page indicator sensor 83 is reduced. Such a reduction in intensity causes a likewise reduction in the magnitude of the signal 200 as shown in the signal in the regions 210 of FIG. 2. The reduction in intensity of the projected page indicator image continues as the reference beam angle of incidence is further varied until the projected data page image substantially disappears as indicated by regions 220 of the page indicator sensor signal 200.

It is possible to identify when a data page image is projected with an adequate SNR for reading by the sensor elements 81 by detecting when the image intensity of the page indicator satisfies a threshold value. An exemplary threshold value is shown in FIG. 3 as dashed line 230.

Accordingly, a data page image can be projected on the sensor elements 81 of FIG. 1 in the following manner: (1) the reference beam angle of incidence is varied within a particular range for a desired data page, (2) Upon generation of a page indicator sensor output signal 200 having a magnitude greater than the threshold value 230, the data is read from the corresponding projected data page image by the sensor elements 81.

In an exemplary playback system according to the invention relying on Bragg selectivity, the reference beam angle of incidence can be stepped or substantially continuously varied across the range used for recording, that can be on the order of 10° , while the intensity of the projected page indicator is detected at an approximate frequency on the order of 1000 times/s. In such a system employing stepped angle variations, an exemplary step size can be on the order of $10^{-5}$ rad, that can be achieved by a conventional acousto-optic cell. Further, in such a system, the projected page indicator brightness can be monitored at each step or successive number of steps or intermittently during the variation of the reference beam angle.

It is further possible to monitor for a signal peak of the image quality for determining when the data page projection has adequate SNR for reading by the sensor elements 81. Also, the signal 200 can be used as a basis for varying the playback system parameter to cause a substantially high quality image of the page indicator to be projected on the sensor 83 whether to satisfy a threshold measure, peak detect measure or otherwise.

In the system 1 of FIG. 1, it is possible to use separate sensors for the page indicator sensor 83 and sensor array 81 in a combined arrangement. For instance, a conventional CCD sensor array can be used for the data page indicator sensor array 81 and a conventional photodetector can be employed for the page indicator sensor 83. The page indicator sensor 83 can have a detection area larger or smaller than the corresponding area of the page indicator image. However, it is advantageous to use a sensor having a larger detection area to compensate for misalignment between the projection and the detector 80. Such a large sensor 83 can also advantageously perform detection of the page indicator image 110 at a lower SNR than would otherwise be used for the sensor elements 130 for reading the data page 120.

Also, it is advantageous for the page indicator image 110 to be larger than a data pixel in the data page image 120 and the corresponding sensor elements 130. It is possible for page indicator image 110 to be on the order of 10 to 100 times larger. The larger page indicator image 110 causes a greater amount of light to be projected on the sensor 83 enabling the sensor 83 to more rapidly detect the light and provide the corresponding feedback.

It is also possible to employ a single large sensor array having separately addressable regions for the page indicator sensor 83 and the data page indicator sensor array 81. Sensor regions that are individually addressable can be separately activated to provide an output signal without having to read the entire array of elements as is required in CCD arrays. Accordingly, a region of at least one individually-addressable sensor element can be employed for the page indicator sensor 83 and another region with a plurality of individually-addressable sensor elements can be used for the data page indicator sensor array 81.

In alternative embodiment, the page indicator image can be used to indicate the relative position of the storage medium 25 and correspondingly its alignment with respect to the system. The page indicator image can be stored in the storage medium 25 substantially superimposed over, for example, a Fourier transform of a data page image. In this manner, a corresponding projection of the Fourier transform of the storage medium 25 through an odd number of lenses in a 4-F configuration provides the restored data page image, while a substantially simultaneous projection of the image through an even number of lenses in a 4-F configuration provides an image of the recalled alignment page indicator.

These data page and alignment page indicator images can be separated from one another optically using, for example, a beam splitter, e.g., partially reflecting mirror. Such a beam splitter can be positioned after an odd number of the lenses such that a portion of the energy of the projected images is reflected by the beam splitter to a sensor array of the detector 80 for reading of the data page image, while the remaining portion of the energy of the projected images is transmitted through the beam splitter and an additional odd number of lenses onto a page indicator sensor 83 for storage medium alignment detection.

Such use of an page indicator for alignment can provide a direct measure of the relative position of the storage medium 25. Thus, for example, in a system that uses a multiplexing system parameter that corresponds to the relative shift between the storage medium 25 and the reference beam 5 to record data page images, the previously described measurement technique can detect the relative position of the storage medium 25 during playback and facilitate access to the desired data page based on the relative shift. Moreover, such a measurement technique also enables improved playback alignment resulting in a corresponding improved SNR and high diffraction efficiency.

Thus, the page indicator can be used to indicate the relative position of the storage medium 25, alone in combination, with providing another measure of quality such as projected image intensity. It should be readily understood that for the measuring the relative position of the storage medium 25, the page indicator image should be detected by the sensor 83 in the transformed plane in which the associated data page image was recorded in the storage medium 25. However, for other quality measures, such as projection intensity, it is possible to detect the page indicator in the transformed plane or the plane of the data page image readable by the detector 80.

An advantageous large single sensor array for use as the detector 80 is an active pixel sensor (APS) array, such as a CMOS APS array. A CMOS APS array includes sensor elements or regions that are individually addressable and produce respective electrical signals corresponding to the magnitude of detected light. APS arrays can be manufactured at low cost and typically consume relative small amounts of power, e.g., typically 1% of the power consumed by comparable CCD sensor arrays and provide better performance than CCD arrays at room temperature. Also, CMOS circuitry for processing the electrical signals produced by the APS can be located on the same CMOS chip as the APS array resulting in a compact detector arrangement. Moreover, because an APS array has individually addressable sensor regions or elements, it is advantageously possible to read particular portions of a projected data page substantially faster than with a CCD which must read the entire data page. The use of a CMOS APS sensor also enables the detection of the page indicator at an adequate rate such as, for example, 5000 samples per second to facilitate data access and retrieval in a time duration on the order of that for conventional magnetic storage devices.

It is presently possible to produce CMOS APS detectors having sensor elements with detection areas on the order of 5 $\mu$m ×5 $\mu$m to 200 $\mu$m ×200 $\mu$m. Moreover, it is possible for CMOS APS detectors to have, for example, on the order of $10^6$ sensor elements which is sufficient to read a data page having up to approximately 1 Mbit of information. CMOS APS detectors are described in greater detail in A. Dickinson et al., "Standard CMOS Active Pixel Image Sensors for Multimedia Applications", *Sixteenth Conference on Advanced Research in VLSI*, pp. 214–224 (Chapel Hill, N.C., Mar. 27–29, 1995), which is incorporated by reference herein.

The face of an exemplary CMOS APS array detector 80 is shown in FIG. 3 and includes an array of individually addressable sensor elements 130 or regions of sensor elements 130. In FIG. 3, a group of at least one sensor element 130 acts as the page indicator sensor 83 of FIG. 1 and are shown within a corresponding dashed outline. In a similar manner, another group of sensor elements 130 act as the data page sensor array 81 of FIG. 1 and are contained within a corresponding dashed outline. The page indicator image 10 and associated data page image 120 are shown projected over these respective groups of sensors 130. It is desirable to use a group of sensor elements 130 or a single relatively large sensor for the page indicator sensor 83 that covers an area larger than a corresponding page indicator image 110 to compensate for possible misalignment of pixel registration. For example, a group of 30×30 sensor elements 130 can be used to detect a page indicator image 110 that typically covers an area of 20×20 sensor elements. Such a large sensor 83 can also perform detection of the page indicator image 110 at a lower SNR than would otherwise be used for the sensor elements 130 for reading the data page 120.

An optional group of sensors within dashed outline 140 detect an image of page identity information 145, such as a page number, concerning the corresponding projected data page 120. The page identity information is stored in the same multiplexed manner as the associated data page and page indicator information and is detectable when the page indicator and data page images are projected. Accordingly, when a page indicator 110 is detected, for example, having an intensity above a threshold level, the page identity information is readable before the data page 120 is read, and if the projected data page image is not the desired data page, the system parameter for multiplexing can be varied accordingly based on the detected page identity information 145. For instance, if the desired data page is identified as page number 4, and the projected data page is page number 2, then the approximate required change in the system parameter for multiplexing can be determined to cause the image of data page 4 to be projected. In an alternative manner, the reference beam angle of incidence can then be varied through signal peaks corresponding to a relative shift from the second data page to the fourth data page.

It is possible to encode the page identity information 145 using, for example, larger code symbols than is used for information in the data page 120 or the sensor elements 130. In this manner, if a misalignment of the pixel registration between the projected pixels of the data page image 120 and the sensor elements 81 occurs, then the page identity information 145 is still readable resulting in the projection of the desired page before any pixel registration correction is performed. Typically, data bits for the page identity information 145 that are, for example, from one to five times the size of the data bits of the data page 110 can be used to advantageously read the page identity despite potential misalignment in pixel registration. Also, it is possible for the page identity information 145 to be disposed proximate the data page 120 as shown in FIG. 3 or alternatively within the data page 120. It is desirable to detect the page identity information typically at a frequency on the order of approximately 1 KHz when the page indicator image is monitored at a frequency on the order of approximately 5 KHz.

Pixel registration or alignment of the projected data pixels of the data page with the sensor elements 81 can be achieved by another feedback technique in accordance with the invention. In FIG. 3, groups 170 of sensor elements 130 are used as pixel registration sensors to detect pixel registration keys or marks stored in the storage medium using the same recording system characteristic as the recording of the associated data page and page indicator. Because the pixel registration keys 160 are stored in the same manner as the associated data page and indicator, images 160 of the keys are projected on the pixel registration sensors 170 when the data page and page indicator images 120 and 110 are projected. These pixel registration keys 160 are also in a known registration with the data pixels in the associated projected data page 120. These pixel registrations key images 160 facilitate alignment between the sensor array elements 130 and the data pixels in the data page image to enable reading of the data contained therein.

It is possible to determine the amount of misalignment in pixel registration based on a comparison of the detected location and orientation of the projected pixel registration key images with the expected projection locations of such images. As a result, drive mechanisms coupled to the detector 80 or other components of the system 1 is employable to provide the relative rotational and/or translational movement between the projected data page 120 and the sensor elements 130 to compensate for this determined misalignment. It is desirable for the drive mechanism to have a movement resolution of at least one-quarter the width or height of a sensor element 130 and a total movement range of at least one-half the width or height of a sensor element 130.

Figure 4:
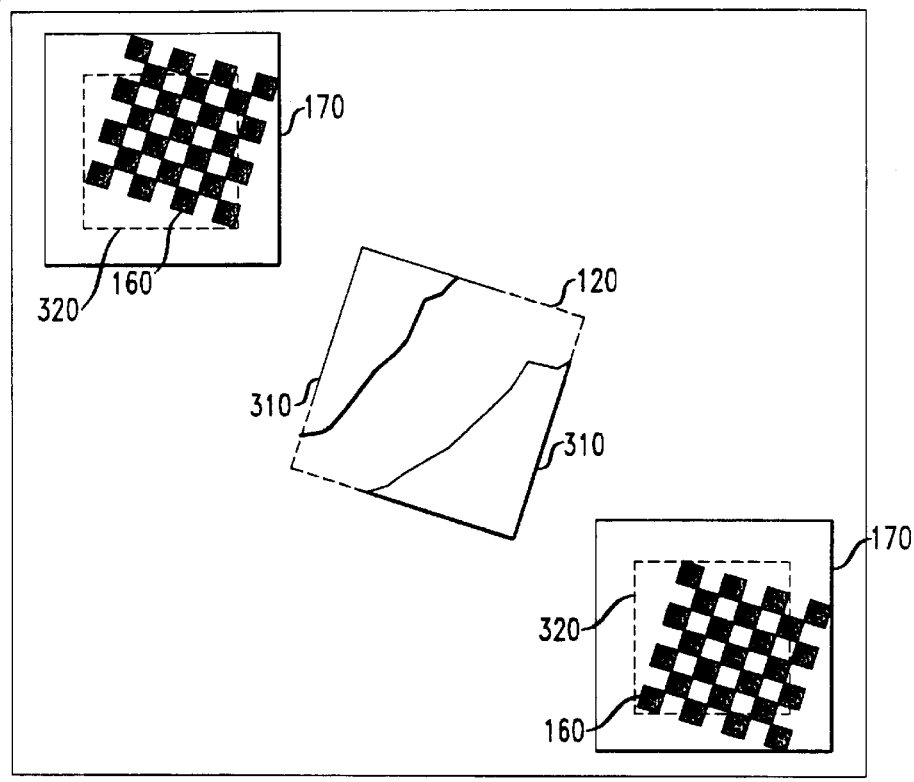
FIG. 4 illustrates an exemplary projection of a data page image and optional pixel registration pattern images on a data page detector of FIG. 2 for use in achieving pixel alignment.

An exemplary technique for performing the pixel registration alignment will now be described with respect to enlarged views of the pixel registration keys 160 on the sensor element groups 170 shown in FIG. 4. In FIG. 4, only enlarged portions of the detector 80 proximate opposite corners 310 of the projected data image 120 are shown for ease of illustration. Groups of sensor elements shown by outlines 320 correspond to the expected projection locations for the images of the pixel registration keys patterns 160 for a known pixel alignment.

In accordance with the exemplary pixel registration technique, the sensor elements in the groups 170 are activated and generate signals based on their detected illumination. From such signals, the locations of the projected keys 160 are detected and the locations of the respective centers of these keys are estimated. Then, the amount of rotation and translation required from the driver can be determined from the respective distances between these estimated projected key centers and the corresponding centers of the expected projection locations 320.

Figure 5:
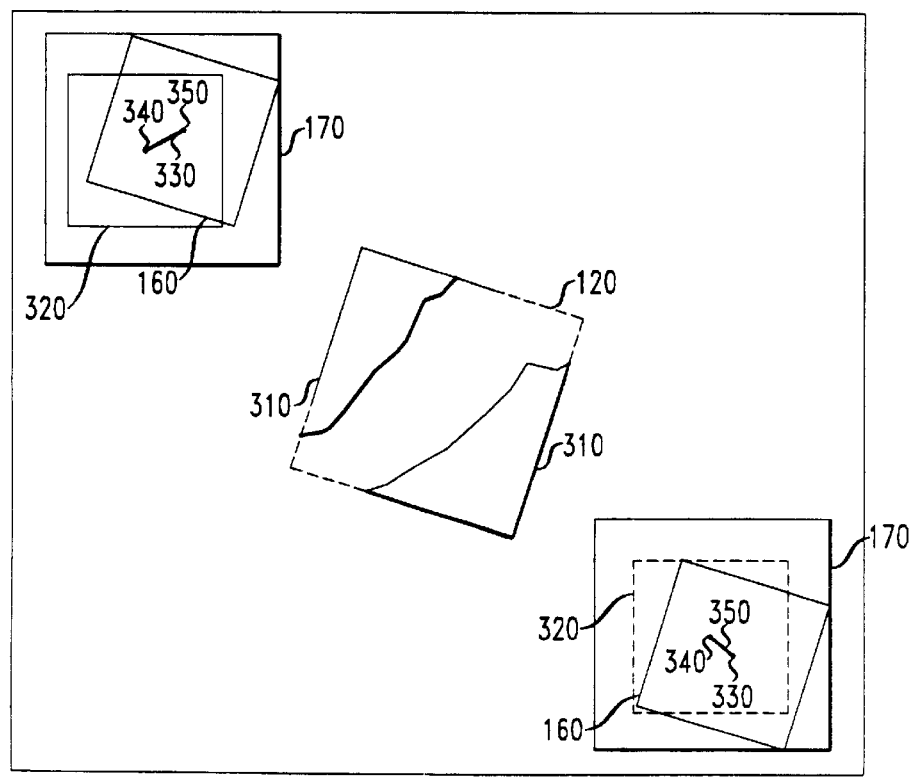
FIG. 5 illustrates center of pattern diagrams for the configuration of FIG. 4.

FIG. 5 corresponds to FIG. 4, except that the projected pixel registration keys 160 and the expected projection locations 320 have been represented by corresponding outlines. The centers of such outlines are shown by reference numbers 330 and 340, respectively. Vectors 350 are shown connecting the two centers 330 and 340 and represent the misalignment between the pixels of the projected image and the sensor elements 130. These vectors 350 also provide the amount of rotational and translational movement required to align the pixels and sensor elements 130.

The amount of rotational movement as well as the corresponding rotational pivot point can be determined based on both of the vectors 350. It is possible that such movement aligns the projected pixel registration keys 160 directly over the expected projection locations 320. However, it is also possible to provide rotational and translational movement that achieves pixel alignment with resulting projected pixel registration key locations that do not correspond to the expected projection locations if the detection area of the sensor elements 130 is larger than the projected image. In such instance, the sensor elements 130 can be aligned with a substantially nearest pixel that is projected with the data page 120 which is not necessarily the position of the expected data page projection. Because APS arrays have individually addressable regions or sensor elements, data from the projected data page 120 can be read substantially independent of where the data page 120 is projected on the array.

Accordingly, pixel registration can be achieved in a single process by detecting and correcting misalignment based on the estimated center of the projected key in accordance with the invention. The pixel registration key 160 can include pixel groups of various different shapes and pixel pattern configurations including, for example, solid blocks, for this alignment technique. However, the use of pixel registration key patterns having configurations of light pixels and dark pixels, such as, for example, bar groups having bars of equal or different widths and spacing, checkerboards, or sparse checkerboards with repeated patterns of a light pixel surrounded by eight dark pixels, facilitate the use of a second process which can fine tune the alignment of the sensor elements and the pixel registration.

In accordance with this second alignment process, the system I estimates the difference between the location of the projected key image and the expected location to within an accuracy that is less than the size of a sensor element 130. These differences correspond to the pixel misalignment that is corrected by the rotational and translational corrective movement. For instance, a pixel registration key employing bar group sets containing bars of dark pixels of varying width and separation on a background of light pixels can be used with such a technique. When this pixel registration key is projected onto the sensor elements 130, the detected intensity of the projected pixels proximate the edges of the bars is compared to the detected strength of the projected pixels in the center of the bars as well as the background of the key 160. The differences in the detected intensities based on such comparisons indicates the misalignment of the bar edges to within an accuracy that is less than the size of a sensor element 130. Such misalignment can then be corrected accordingly using the drive mechanisms.

In a similar manner, a sparse checkerboard pattern with a repeated sequence of a light pixel surrounded by eight dark pixels can be employed as the registration key 160. Pixel alignment with such keys is related to the projected contrast between the dark center and the brighter surrounding ring. Accordingly, alignment can be adjusted to increase, or substantially maximize, this contrast.

The previously described two-step process for achieving pixel registration are for illustration purposes only and is not meant to be a limitation of the invention. It is alternatively possible to employ either process individually or in combination with other registration techniques to achieve pixel alignment according to the invention. Further, a single pixel registration key or multiple registration keys within or adjacent to the data page can be employed. Other patterns than those previously described can be employed with the invention to enable determination of the misalignment based on differences in the location of the projected key versus its expected orientation and position. Such expected orientation and position can be fixed or determined by the system 1 based on the detected location of the image of the pixel registration key.

The pixel registration keys 160, page identity information 145 and page indicator 110 provide the necessary feedback to efficiently project and align a desired data page on the detector 80 for reading the data contained therein. Moreover, if the sensors 83, 140 and 170 are implemented as respective regions of a CMOS APS array, then it is possible to advantageously implement the necessary circuitry for processing the signals from these sensors in the same semiconductor chip or group of chips containing the APS array. In this manner, a single relatively low cost and low power integrated circuit can provide the reading of data pages as well as control the projection and alignment of the desired data page to be read. Also, the individually addressable regions or sensor elements of an APS array make it particularly suitable for pixel registration using the previously described substantially nearest pixel alignment procedure.

Although the respective page indicator 110, page identify information 145 and pixel registration keys 170 are illustrated as separate projected images, it is possible to combine the functions of two or more of these images into lessor number of marks according to the invention. Also, it is possible to employ such mark or marks, whether having combined functions or otherwise, in a region or regions which make up approximately 0.1% to 10% of the projected image area from the storage medium 25. The remaining balance of the projected image area can advantageously contain the data page information. In an exemplary embodiment of the invention, in order to read the data of a desired data page, the multiplexing system characteristic would first be varied to project a data page on the sensors based on the feedback provided by the page indicator sensor as is described with respect to FIGS. 1, 2 and 3. The page identity information would then be read and if the projected page is not the desired page, then the multiplexing system characteristic would be further varied a relative amount to project the desired page as is described with respect to FIG. 3. Then, pixel registration would be achieved using the projected pixel registration key and the pixel registration key sensors as described with respect to FIGS. 4 and 5.

Although several embodiments of the invention have been described in detail above, many modifications can be made without departing from the teaching thereof. All of such modifications are intended to be encompassed within the following claims. For instance, it is possible to employ the feedback techniques for projecting pages, identifying page numbers and for pixel registration, individually or with other sub-combinations not previously described. Also, although the previously described embodiments employ either CCD or CMOS APS sensors for the detector 80 of FIG. 1, it should be understood that other types of detectors 80 where having individually addressable sensor elements or otherwise can be used in accordance with the invention.

The invention claimed is:

1. A method for reading data in a holographic storage system comprising:

directing a light beam at an holographic storage medium for projecting an image on a detector, said storage medium containing an image of at least one page of data;

monitoring a quality of a projection of a page indicator image stored in said storage medium, said page indicator being stored in said medium such that the quality of its projected image is indicative of the projected quality of the corresponding data page image on said detector;

varying a parameter of said system originally used to store said data page and said page indicator in said storage medium; and based on said monitored quality of the page indicator image projection, varying further said parameter or not varying said parameter and reading data from said data page projected on said detector.

2. The method of claim 1 wherein said monitored quality is intensity of the page indicator projection.

3. The method of claim 1 wherein said step of reading said projected data page is performed based on said detection of a threshold quality of said projected page indicator image.

4. The method of claim 1 wherein said step of reading said projected data page is performed based on said detection of an approximate peak in quality of said projected page indicator image.

5. The method of claim 1 wherein said step of monitoring said page indicator is performed by at least one sensor that is separate from a sensor array for said detector.

6. The method of claim 5 wherein said data page is recorded in said storage medium as a transformation with said page indicator recorded substantially superimposed on said data page wherein said step of monitoring monitors a projection of said page indicator in a plane of said transformation.

7. The method of claim 1 wherein said detector is an active pixel sensor array and said step of monitoring said page indicator is performed by at least one sensor element in a region of said sensor array.

8. The method of claim 5 wherein said monitoring step is performed by circuitry disposed in a semiconductor chip containing an active pixel sensor array.

9. The method of claim 1 wherein said step of varying a system parameter at least partially based on said monitored page indicator image quality.

10. The method of claim 1 further comprising:

reading page identity data information from said projected image based on a detected quality of said page indicator image, wherein said page identity information is stored in said medium such that it is projected on said detector when said page indicator is projected on said detector; and further varying said system parameter a relative amount based on said read page identity information to project a desired data page, if a present projected data page is not said desired data page.

11. The method of claim 10 wherein said page identity information is projected in such a manner that the step of reading said page identity information is performed in substantial absence of a pixel registration step.

12. The method of claim 1 further comprising:

detecting a pixel registration key; and moving at least one of said projected data page image or detector in such a way to cause a relative movement of said projected data image on said detector based on said detected position of said pixel registration key to substantially align pixels of said projected data page image with sensor elements of said detector.

13. The method of claim 12 wherein said moving step moves said projected data page image or detector in such a way to cause a relative movement of said projected data image on said detector to achieve substantial alignment of projected data of said data page and the substantially closest sensor element of said detector.

14. The method of claim 12 further comprising determining differences in said detected pixel registration key position and an expected position of the pixel registration key image, wherein said moving step is based on said determined differences.

15. The method of claim 12 further comprising determining an approximate center position of said projected key based on said detected key position, wherein said moving step is based on a difference in said determined approximate key center position and an expected key center position.

16. A data storage system comprising:

a detector;

a light source for directing a light beam at a holographic storage medium having at least one page of data and a corresponding page indicator image stored therein, said page indicator being stored in said medium such that its projected image quality is indicative of a projected image quality of said data page on said detector;

a page indicator sensor associated with said detector, said light beam causing a projected image on said detector, wherein said page indicator sensor detects a quality of the projected image of said page indicator image; and a controller coupled to said page indicator sensor, said controller monitoring a quality of said page indicator image detected by said sensor and based on said monitored quality of the page indicator image projection, varying further said parameter or not varying said parameter and reading data from said data page projected on said detector.

17. The system of claim 16 wherein said detector is an active pixel sensor array and said page indicator sensor is at least one sensor element in a region of said array.

18. The system of claim 17 wherein said controller comprises circuitry disposed in a semiconductor chip containing said active pixel sensor array.

19. The system of claim 16 further comprising a page identity sensor associated with said detector and coupled to said controller, said page identity sensor for reading page identity data information in said projected image.

20. The system of claim 19 wherein said detector is an active pixel sensor array and said page identity sensor comprises a plurality of said sensor elements in a region of said detector array.

21. The system of claim 16 further comprising:

at least one pixel registration sensor associated with said detector and coupled to said controller, said pixel registration sensor for detecting a pixel registration key of a projected image; and at least one driver coupled to said detector, said controller for causing said driver to move said detector relative to a projected data page image based on said detected position of said pixel registration key in order to substantially align pixels of said projected data page image with corresponding sensor elements of said detector.

22. The system of claim 21 wherein said detector is an active pixel sensor array and said pixel registration sensor comprises a plurality of said sensor elements in a region of said detector array.

* * * * *